Aug. 9, 1966 C. R. WILHELMSEN 3,265,982

COMMON EMITTER TRANSISTOR AMPLIFIER INCLUDING A HEAT SINK

Filed Oct. 24, 1963 2 Sheets-Sheet 1

Aug. 9, 1966 C. R. WILHELMSEN 3,265,982

COMMON EMITTER TRANSISTOR AMPLIFIER INCLUDING A HEAT SINK

Filed Oct. 24, 1963 2 Sheets-Sheet 2

United States Patent Office 3,265,982
Patented August 9, 1966

3,265,982

COMMON EMITTER TRANSISTOR AMPLIFIER INCLUDING A HEAT SINK

Carl R. Wilhelmsen, Huntington Station, N.Y., assignor to Hazeltine Research Inc., a corporation of Illinois Filed Oct. 24, 1963, Ser. No. 318,711
4 Claims. (Cl. 330—23)

Figure 1:
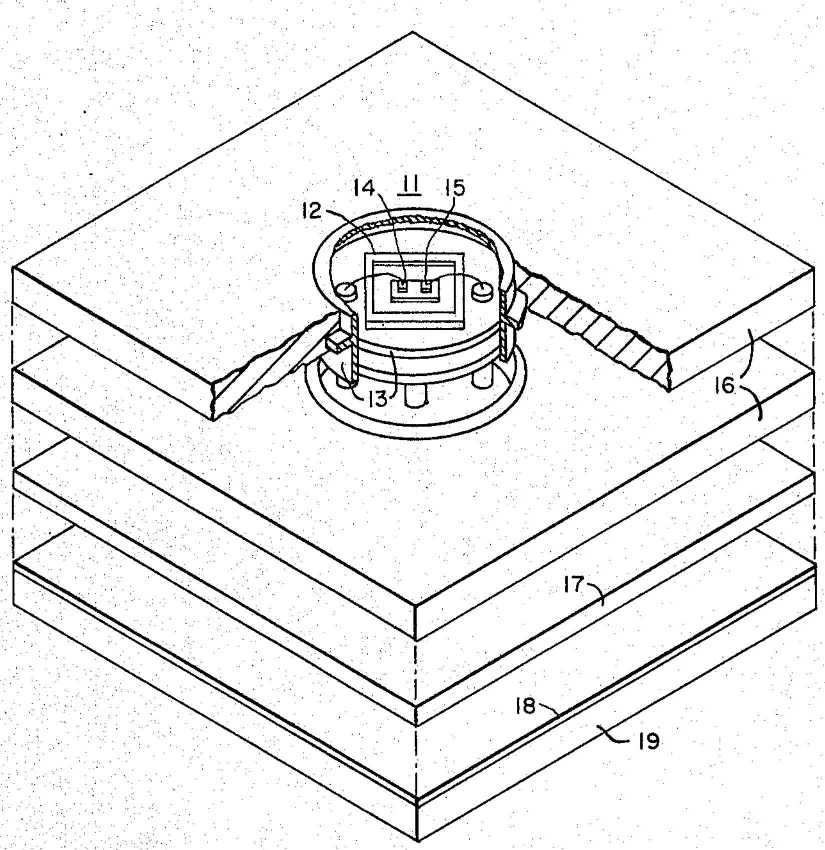

This invention is concerned with a transistor amplifier and more particularly with a transistor amplifier where the transistor is so constructed that the collector material is in physical contact with the transistor case.

While the invention has general application, it will be described with reference to a small, low cost, solid state transmitter capable of operating from a twelve (12) volt supply while providing a power output in excess of one-half (½) watt in the frequency range of 156 to 180 mc.p.s. While many different circuit designs and transistor types may be used in this type of transmitter, the lower voltage supply and low cost, small size requirements dictate the use of a particular type of transistor for this application. These requirements may be met by using a gas diffused base germanium mesa transistor such as the types 2N1561 and 2N1562 manufactured by Motorola Corporation. These transistors and others in this particular series are so constructed that the collector material is in physical and electrical contact with the transistor outer case. Furthermore, when these transistors are operated at power output levels of, for example, 100 mw. to 1 watt, a heat sink is required. The heat sink is generally placed in contact with the outside of the transistor case in order to convey the generated heat away from the transistor. Because of this physical configuration, it is common practice to operate such transistors with the collector grounded. That is, the transistor case, the heat sink and the transistor collector terminal are all coupled to the ground plane of the circuit. It is common practice to operate with such transistors in either emitter-follower or bootstrap arrangements. However, operation in these modes may introduce instability problems, power gain limitations or high circuit capacitance requirements.

It is an object of the present invention, therefore, to provide an arrangement which substantially avoids one or more of the limitations of the described prior arrangements.

It is a further object of the present invention to provide a transistor amplifier utilizing a transistor so constructed that the collector material is in physical contact with the transistor case and arranged to operate in the common emitter configuration.

It is still a further object of the present invention to provide a transistor amplifier capable of operating from a low voltage supply while providing substantial power or voltage gain in the 50 mc.p.s. frequency region.

In accordance with the invention, a transistor amplifier wherein the transistor is so constructed that the collector material is in physical contact with the transistor case, comprises means in physical contact with the transistor case for dissipating heat generated during operation of the transistor. The transistor amplifier further comprises means for electrically insulating the heat dissipating means, the case, and the collector from an electrical reference potential conductor and means for supplying a bias potential to the collector. The transistor amplifier further comprises means for supplying input signals to the base of the transistor and means for coupling the emitter of the transistor to the electrical reference potential conductor, whereby the combination of the heat dissipating means, the insulating means and the electrical reference potential conductor produces a capacitive reactance between the collector and emitter terminals and the transistor is arranged to operate in the common emitter configuration.

For a better understanding of the present invention, together with other and further objects thereof, reference is had to the following description taken in connection with the accompanying drawings, and its scope will be pointed out in the appended claims.

Figure 2:
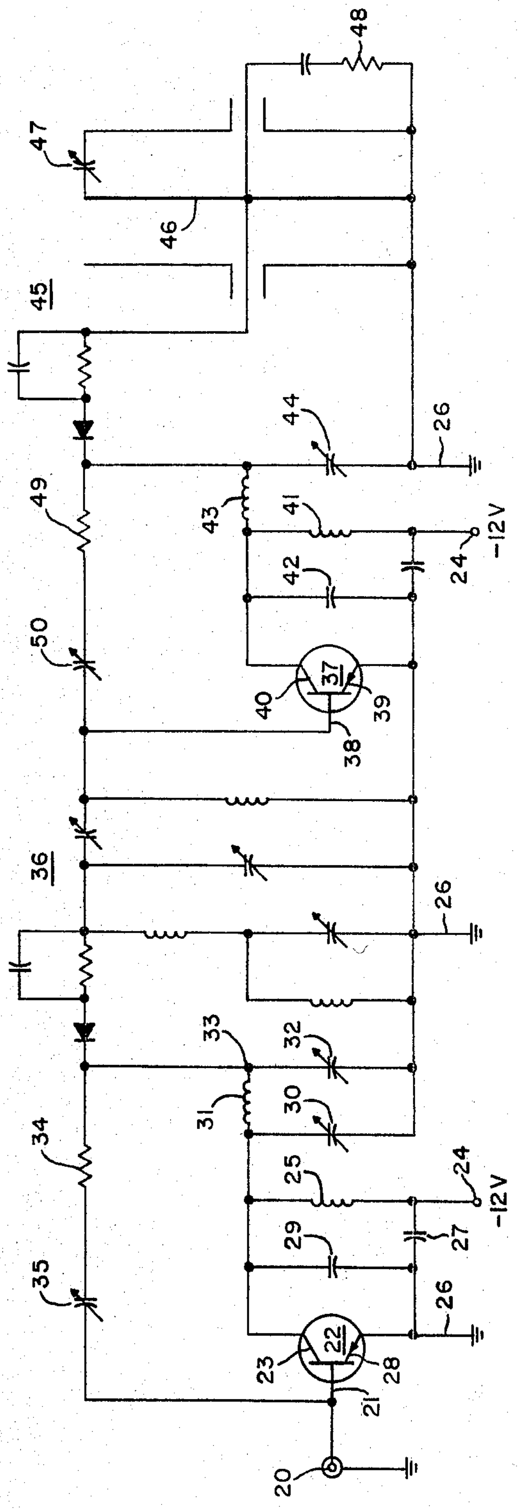

Referring to the drawings:

FIG. 1 is a modified cutaway view showing the physical relationship of the several parts utilized in mounting a transistor of the type involved in this invention on a printed circuit board or a chassis, and FIG. 2 is an electrical schematic of a solid state transmitter utilizing a transistor mounted in accordance with FIG. 1 and embodying the present invention.

Referring now to FIG. 1, transistor 11 which may for example be of the type 2N1561 or 2N1562 manufactured by Motorola Corporation, is constructed such that the block of germanium collector material 12 is in physical contact with the metallic transistor case 13. Transistor 11 further includes base contact 14 and emitter contact 15. The particular transistor mentioned here is of the gas diffused base germanium mesa type. The apparatus further includes means in physical contact with transistor case 13, such as the two halves of a heat sink 16 mounted in physical contact with transistor case 13 for dissipating heat generated during operation of transistor 11. The apparatus further includes means such as mica-insulating wafer 17 mounted between heat sink 16 and an electrical reference potential conductor 18 on mounting board 19. Mica-insulating wafer 17 serves to electrically insulate heat sink 16, transistor case 13, and collector 12 from electrical reference potential conductor 18.

During operation of transistor 11, heat generated by the electric current flowing through transistor 11 is conducted to heat sink 16 via transistor case 13 and thus dissipated.

Referring now to FIG. 2, the relationship between the physical configuration of FIG. 1 and the electrical configuration of FIG. 2 will be explained. FIG. 2 is an electrical schematic of the preamplifier and power amplifier stages of a solid state transmitter arranged to provide an output signal at a nominal frequency of 156 mc.p.s. Each of the two stages of the amplifier utilizes a transistor having the same general physical configuration as shown in FIG. 1. The preamplifier stage includes means, such as input terminal 20, for supplying input signals (which may, for example, be either frequency or pulse modulated signals on a 26 mc.p.s. carrier signal) to base electrode 21 of preamplifier transistor 22. Collector electrode 23 of preamplifier transistor 22 is coupled to bias potential supply 24 through self-resonant radio-frequency choke 25. Bias potential supply 24 is by-passed to ground potential conductor 26 by capacitor 27. Emitter electrode 28 is also coupled to ground potential conductor 26. Capacitor 29 coupled between collector electrode 23 and emitter electrode 28 is the capacitance resulting from the combination of heat sink 16, mica-insulating wafer 17 and electrical reference potential conductor 18 shown in FIG. 1. Thus capacitor 29 appears between collector electrode 23 and ground. Tuning capacitance 30 is coupled between collector electrode 23 and ground potential conductor 26. Inductance 31 and capacitance 32 coupled in that order across the terminals of capacitance 30 are ararnged to form a $\pi$ network in conjunction with capacitances 29 and 30 so as to match the output impedance of transistor 22 with the input impedance of the following network. Junction 33 between inductance 31 and capacitance 32 is coupled via the series combination of resistor 34 and capacitor 35 to base electrode 21 of preamplifier transistor 22 for purposes of neutralization.

The output signal produced at junction 33 is coupled via varactor frequency doubler network 36 to power amplifier transistor 37. Power amplifier transistor 37 is arranged as is preamplifier transistor 22 to operate in the grounded emitter mode. That is, the output of varactor frequency doubler network 36 is coupled to base electrode 38, emitter 39 is coupled to ground potential conductor 26 and collector electrode 40 is coupled via radio-frequency choke 41 to negative bias potential supply 24. Capacitor 42 appearing between collector electrode 40 and emitter electrode 39 of power amplifier 37 is formed by a combination such as heat sink 16, mica-insulating wafer 17 and electrical reference potential conductor 18 shown in FIG. 1. Inductance 43 and capacitance 44 coupled in that order between collector terminal 40 and electrical reference potential conductor 26 form a $\pi$ network in conjunction with capacitance 42 so as to match the output impedance of transistor 37 with the input impedance of varactor frequency tripler network 45. Network 45 includes coaxial resonator 46 which is a piece of coaxial line much less than one-quarter wave length such that it is inductive. Capacitance 47 tunes resonator 46 to 156 mc.p.s., the output frequency applied to load resistance 48. Resistor 49 and capacitance 50 provides a neutralizing signal to transistor 37.

In operation the 26 mc.p.s. signal supplied to input terminal 20 is amplified by preamplifier transistor 22 from a level for example of 2.3 mw. input power to a level of 100 mw. output power while drawing 35 ma. from 12 volt bias potential supply 24. Preamplifier transistor 22 may, in such case, be of the type 2N1562. Capacitance 32 is chosen to provide a proper ratio of input capacitance to output capacitance for the $\pi$ matching section to match transistor 22 to the input impedance of varactor frequency doubler network 36. Inductance 31 is chosen to resonate with capacitances 32, 30 and 29 at 26 mc.p.s. Varactor frequency doubler network 36 serves to double the input frequency of 26 mc.p.s. to 27 mc.p.s. so as to provide a higher frequency input signal to power amplifier transistor 37. Power amplifier transistor 37 amplifies the input signal provided by varactor frequency doubler network 36 so as to provide an output signal of approximately 1 watt at 52 mc.p.s. while drawing 220 ma. from 12 volt bias potential supply 24. Power amplifier transistor 37 may, in such case be of the type 2N1561. The $\pi$ section formed by capacitance 42, inductance 43 and capacitance 44 matches the output impedance of power amplifier transistor 37 to the input impedance of varactor frequency tripler network 45. The output of varactor frequency tripler network 45 is delivered to load resistor 48 via the output tank formed by resonator 46 and capacitance 47 so as to provide approximately ½ watt of output power at a frequency of 156 mc.p.s.

Thus, the combination of the mechanical and electrical design of the amplifiers discussed above makes it possible to operate these transistors in the high gain common emitter configuration, to provide an output impedance transformation from the transistor amplifier and to provide a source of neutralizing signals from the collector to the base of the transistor amplifier.

While there has been described what is at present considered to be the preferred embodiment of this invention, it will be obvious to those skilled in the art that various changes and modifications may be made therein without departing from the invention and it is, therefore, aimed to cover all such changes and modifications as fall within the true spirit and scope of the invention.

What is claimed is:

1. A transistor amplifier wherein the transistor is so constructed that the collector material is in physical contact with the transistor case, comprising:

means in physical contact with and external to said transistor case for dissipating heat generated during operation of said transistor;

means coupled between said heat dissipating means and an electrical reference potential conductor for electrically insulating said heat dissipating means, said case, and said collector from said electrical reference potential conductor;

means for supplying a bias potential to said collector;

means for supplying input signals to the base of said transistor;

and means coupling the emitter of said transistor to said electrical reference potential conductor;

whereby the combinaiton of said heat dissipaing means, said insulating means and said electrical reference potential conductor produces a capacitive reactance between the collector and emitter terminals and said transistor is arranged to operate in the common emitter configuration.

2. A transistor amplifier according to claim 1 further comprising:

means including a series combination of inductive reactance and capacitive reactance coupled in that order between said collector and emitter terminals, for forming a $\pi$ network in conjunction with the capacitive reactance produced by the combination of said heat dissipating means, said insulating means and said electrical reference potential conductor;

whereby said transistor is operated in a high gain configuration, an output impedance transformaiton is provided and a neutralizing signal source coupled from said $\pi$ network is available.

3. A transistor amplifier wherein the transistor is so constructed that the collector material is in physical contact with the transistor case, comprising:

a heat sink mounted on said transistor case for dissipating heat generated during transistor operation;

a mica-insulating wafer mounted between said heat sink and an electrical reference potential conductor;

and means for supplying bias potentials and input signals to said transistor such that said transistor is arranged to operate in the common emitter configuration, the emitter terminal being connected to said reference potential conductor;

whereby the combination of said heat sink, said mica-insulating wafer and said electrical reference potential conductor produces a capacitive reactance between the collector and emitter terminals of said transistor.

4. A transistor amplifier according to claim 3 further comprising:

means including a series combination of inductive reactance and capacitive reactance coupled in that order between said collector and emitter terminals, for forming a $\pi$ network in conjunction with the capacitive reactance produced by the combination of said heat sink, said mica-insulating wafer and said electrical reference potential conductor;

whereby said transistor is operated in a high gain configuration, an output impedance transformation is provided and a neutralizing signal source coupled from said $\pi$ network is available.

References Cited by the Examiner

UNITED STATES PATENTS

| | | | |
|---|---|---|---|
| 2,817,048 | 12/1957 | Thuermel et al. | 317—234 |
| 2,967,984 | 1/1961 | Jamison. | |
| 3,068,415 | 12/1962 | Johnson | 330—27 X |
| 3,128,431 | 4/1964 | Walker | 330—66 X |
| 3,183,407 | 5/1965 | Yasuda et al. | 317—234 X |
| 3,187,226 | 6/1965 | Kates | 317—100 |

OTHER REFERENCES

Rheinfelder: Pi-Network Matching With The 2N1561 Transistor, 2 pages, AN115, 1960, Motorola Semiconductor Products, Inc.

ROY LAKE, *Primary Examiner.*

F. D. PARIS, *Assistant Examiner.*